(12) United States Patent
Liu et al.

(10) Patent No.: US 12,298,183 B2
(45) Date of Patent: May 13, 2025

(54) FLEXIBLE SENSING DEVICE AND METHOD FOR MANUFACTURING THE SAME

(71) Applicant: InnoLux Corporation, Miao-Li County (TW)

(72) Inventors: Yu-Tsung Liu, Miao-Li County (TW); I-An Yao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/410,338

(22) Filed: Jan. 11, 2024

(65) Prior Publication Data

US 2024/0255351 A1    Aug. 1, 2024

Related U.S. Application Data

(60) Provisional application No. 63/442,213, filed on Jan. 31, 2023.

(30) Foreign Application Priority Data

Sep. 20, 2023  (CN) .......................... 202311214439.X

(51) Int. Cl.
*G01J 3/28* (2006.01)
*H10N 19/00* (2023.01)

(52) U.S. Cl.
CPC ............ *G01J 3/2803* (2013.01); *H10N 19/00* (2023.02)

(58) Field of Classification Search
CPC .. G01J 3/2803; G01J 5/0853; G01J 2005/202; G01J 5/045; G01J 5/20; G01J 5/0225; G01J 5/0025; H10N 19/00
See application file for complete search history.

(56) References Cited

U.S. PATENT DOCUMENTS

| | | | |
|---|---|---|---|
| 2008/0304821 A1* | 12/2008 | Jeung | H04N 23/55 438/66 |
| 2010/0310137 A1* | 12/2010 | Chou | G06V 40/13 250/214.1 |
| 2012/0052654 A1* | 3/2012 | Yang | H01L 21/6835 156/60 |
| 2014/0267756 A1 | 9/2014 | Gousev et al. | |

(Continued)

*Primary Examiner* — Thanh Luu
*Assistant Examiner* — Mai Thi Ngoc Tran
(74) *Attorney, Agent, or Firm* — MUNCY, GEISSLER, OLDS & LOWE, P.C.

(57) ABSTRACT

The present disclosure provides a sensing device and a method for manufacturing the same. The method for manufacturing the sensing device includes the following steps: providing a first temporary substrate, wherein the first temporary substrate includes: a first carrier; a first substrate disposed on the first carrier; and a plurality of sensing elements disposed on the first substrate; providing a second temporary substrate, wherein the second temporary substrate includes: a second carrier; and a second substrate disposed on the second carrier; assembling the first temporary substrate and the second temporary substrate to bond the first substrate and the second substrate; removing the first carrier and disposing the first substrate on a supporting film; and removing the second carrier, wherein the first substrate and the second substrate are respectively a flexible substrate.

18 Claims, 7 Drawing Sheets

(56) References Cited

U.S. PATENT DOCUMENTS

| | | | |
|---|---|---|---|
| 2014/0285733 A1* | 9/2014 | Chi | G06F 3/0445 |
| | | | 349/12 |
| 2017/0004343 A1* | 1/2017 | Xie | G06F 3/0416 |
| 2021/0397808 A1* | 12/2021 | Gupta | G02B 1/115 |
| 2023/0177300 A1* | 6/2023 | Lee | G06K 19/0718 |
| | | | 438/106 |
| 2023/0229035 A1* | 7/2023 | Park | G02F 1/1323 |
| | | | 359/296 |

* cited by examiner

FLEXIBLE SENSING DEVICE AND METHOD FOR MANUFACTURING THE SAME

CROSS-REFERENCE TO RELATED APPLICATIONS

This application claims the benefits of the Chinese patent application Serial Number 202311214439.X, filed on Sep. 20, 2023, the subject matter of which is incorporated herein by reference.

This application claims the benefit of filing date of U.S. Provisional Application Ser. No. 63/442,213, filed Jan. 31, 2023 under 35 USC § 119(e)(1).

BACKGROUND

Field

The present disclosure relates to a sensing device and a method for manufacturing the same. More specifically, the present disclosure relates to a flexible sensing device and a method for manufacturing the same.

Description of Related Art

The sensing device has the advantages of detection without contact with objects, high sensitivity, and high anti-noise characteristics. It can be used in object distance sensing, temperature detection, human body detection, etc., and has high application value.

However, due to limitations in manufacturing processes and materials, most of the sensing devices currently on the market are inflexible sensing devices, and the applications thereof are limited. Therefore, it is desirable to provide a sensing device to improve the above problems.

SUMMARY

The present disclosure provides a method for manufacturing a sensing device, which comprises the following steps: providing a first temporary substrate, wherein the first temporary substrate comprises: a first carrier; a first substrate disposed on the first carrier; and a plurality of sensing elements disposed on the first substrate; providing a second temporary substrate, wherein the second temporary substrate comprises: a second carrier; and a second substrate disposed on the second carrier; assembling the first temporary substrate and the second temporary substrate to bond the first substrate and the second substrate; removing the first carrier and disposing the first substrate on a supporting film; and removing the second carrier, wherein the first substrate and the second substrate are respectively a flexible substrate.

The present disclosure further provides a sensing device which comprises: a supporting film; a first substrate disposed on the supporting film; a plurality of sensing elements disposed on the first substrate; and a second substrate disposed corresponding to the first substrate and bonded to the first substrate, wherein the first substrate and the second substrate are respectively a flexible substrate.

Other novel features of the disclosure will become more apparent from the following detailed description when taken in conjunction with the accompanying drawings.

DETAILED DESCRIPTION

Figure 1A:
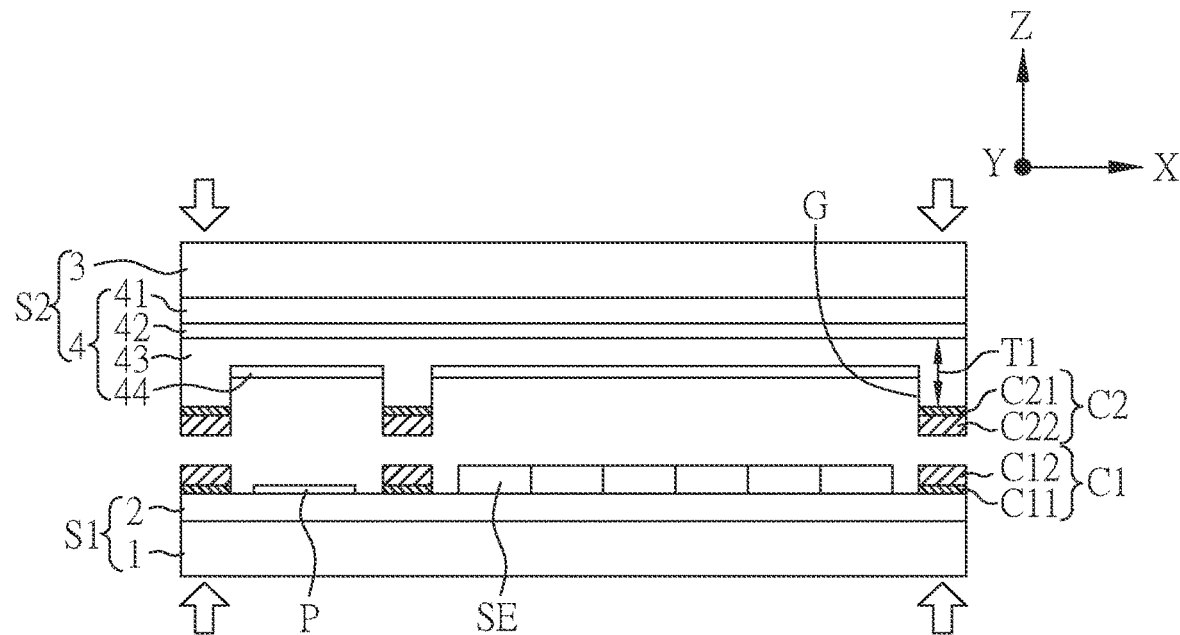
FIG. 1A to FIG. 1F are schematic views showing a method for manufacturing a sensing device according to one embodiment of the present disclosure.

The following is specific embodiments to illustrate the implementation of the present disclosure. Those who are familiar with this technique can easily understand the other advantages and effects of the present disclosure from the content disclosed in the present specification. The present disclosure can also be implemented or applied by other different specific embodiments, and various details in the present specification can also be modified and changed according to different viewpoints and applications without departing from the spirit of the present disclosure.

It should be noted that, in the present specification, when a component is described to have an element, it means that the component may have one or more of the elements, and it does not mean that the component has only one of the element, except otherwise specified. Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

In the specification and the appended claims of the present disclosure, certain words are used to refer to specific elements. Those skilled in the art should understand that electronic device manufacturers may refer to the same components by different names. The present specification does not intend to distinguish between elements that have the same function but have different names. In the following description and claims, words such as "comprising", "including", "containing", and "having" are open-ended words, so they should be interpreted as meaning "containing but not limited to . . . ". Therefore, when the terms "comprising", "including", "containing" and/or "having" are used in the description of the present disclosure, they specify the existence of corresponding features, regions, steps, operations and/or components, but do not exclude the existence of one or more corresponding features, regions, steps, operations and/or components.

The terms, such as "about", "equal to", "equal" or "same", "substantially", or "approximately", are generally interpreted as within 10%, 5%, 3%, 2%, 1%, or 0.5% of a given value or range. The quantity given here is an approximate quantity, that is, without specifying "about", "approximately", "substantially" and "approximately", "about", "approximately", "substantially" and "approximately" can still be implied. Furthermore, when a value is "in a range from a first value to a second value" or "in a range between a first value and a second value", the value can be the first value, the second value, or another value between the first value and the second value.

In the present specification, except otherwise specified, the terms (including technical and scientific terms) used herein have the meanings generally known by a person skilled in the art. It should be noted that, except otherwise specified, in the embodiments of the present disclosure, these terms (for example, the terms defined in the generally used dictionary) should have the meanings identical to those known in the art, the background of the present disclosure or the context of the present specification, and should not be read by an ideal or over-formal way.

In addition, relative terms such as "below" or "under" and "on", "above" or "over" may be used in the embodiments to describe the relative relationship between one element and another element in the drawings. It will be understood that if the device in the drawing was turned upside down, elements described on the "lower" side would then become elements described on the "upper" side. When a unit (for example, a layer or a region) is referred to as being "on" another unit, it can be directly on the another unit or there may be other units therebetween. Furthermore, when a unit is said to be "directly on another unit", there is no unit therebetween. Moreover, when a unit is said to be "on another unit", the two have a top-down relationship in a top view, and the unit can be disposed above or below the another unit, and the top-bottom relationship depends on the orientation of the device.

In the present disclosure, the thickness may be measured by using an optical microscope or by a cross-sectional image in an electron microscope, but the present disclosure is not limited thereto. Furthermore, any two values or directions used for comparison may have certain errors. If the first value is equal to the second value, it implies that there may be an error of about 10% between the first value and the second value. If the first direction is perpendicular to the second direction, the angle between the first direction and the second direction may be between 80° and 100°. If the first direction is parallel to the second direction, the angle between the first direction and the second direction may be between 0° and 10°.

It should be noted that the technical solutions provided by different embodiments hereinafter may be replaced, combined or used in combination, so as to constitute another embodiment without violating the spirit of the present disclosure.

FIG. 1A to FIG. 1F are schematic views showing a method for manufacturing a sensing device according to one embodiment of the present disclosure.

In one embodiment of the present disclosure, the method for manufacturing a sensing device may comprise the following steps: providing a first temporary substrate S1 and a second temporary substrate S2. Herein, as shown in FIG. 1A, the first temporary substrate S1 comprises: a first carrier 1; a first substrate 2 disposed on the first carrier 1; and a plurality of sensing elements SE disposed on the first substrate 2. The second temporary substrate S2 comprises: a second carrier 3; and a second substrate 4 disposed on the second carrier 3. More specifically, the first temporary substrate S1 may comprise a plurality of first bonding units C1 disposed on the first substrate 2, and the plurality of sensing elements SE are disposed between two adjacent first bonding units C1. The second temporary substrate S2 may comprise a plurality of second bonding units C2 disposed on the second substrate 4, wherein the second substrate may comprise a cavity G, and the cavity G locates between two adjacent second bonding units C2.

In the present disclosure, the materials of the first carrier 1 and the second carrier 3 may respectively comprise glass, quartz, sapphire, ceramics, plastic, other suitable substrate materials or a combination thereof, but the present disclosure is not limited thereto. In the present disclosure, the first substrate 2 and the second substrate 4 may respectively be a flexible substrate, and the first substrate 2 and the second substrate 4 may 4 may respectively comprise other components. The first substrate 2 may comprise, for example, a circuit layer (not shown in the figure), electronic components or a combination thereof, which will be described in detail later. The second substrate 4, for example, may comprise: a substrate 41 disposed on the second carrier 3; an optical film 42 disposed on the substrate 41; a filter layer 43 disposed on the optical film 42; and an optical film 44 disposed on the filter layer 43, wherein the filter layer 43 is disposed between the optical film 42 and the optical film 44. The optical film 42 and the optical film 44 and/or the filter layer 43 may be used to reduce the reflection of the incident light and/or block the light in the unwanted wavelength range, so as to increase the transmittance of the light in the specified wavelength range, thereby improving the sensing effect. In one embodiment of the present disclosure, at least one of the optical film 42 and the optical film 44 may be selected and provided. In one embodiment of the present disclosure, for example, as shown in FIG. 1A, the cavity G of the second substrate 4 may be formed by the filter layer 43 (for example, the cavity G may be formed by patterning the filter layer 43), wherein the optical film 44 is disposed in the cavity G, but the present disclosure is not limited thereto. In the present disclosure, the material of the substrate 41 may comprise polycarbonate (PC), polyimide (PI), polypropylene (PP), polyethylene terephthalate (PET), polymethylmethacrylate (PMMA), other suitable materials or a combination thereof, but the present disclosure is not limited thereto. In the present disclosure, the materials of the optical film 42 and the optical film 44 may be the same or different. The materials of the optical film 42 and the optical film 44 may respectively comprise germanium (Ge), zinc sulfide (ZnS), zinc selenide (ZnSe), magnesium fluoride ($MgF_2$), beryllium fluoride ($BeF_2$), potassium chloride, arsenic trisulfide ($As_2S_3$) or a combination thereof, but the present disclosure is not limited thereto. In the present disclosure, the material of the filter layer 43 may comprise silicon, germanium (Ge), gallium arsenide (GaAs), chalcogenide glass, or a combination thereof, but the present disclosure is not limited thereto. In addition, the thickness T1 of the filter layer 43 may range from 1 μm to 100 μm, for example, may range from 5 μm to 90 μm, 10 μm to 80 μm or 20 μm to 70 μm, but the present disclosure is not limited thereto. When the thickness T1 of the filter layer 43 meets the above range, a flexible sensing device may be achieved.

In the present disclosure, the materials of the first bonding units C1 and the second bonding units C2 may be the same or different. The materials of the first bonding units C1 and the second bonding units C2 may respectively comprise a metal, an alloy thereof, a frit paste, or a combination thereof. The metal may comprise, for example, gold, silver, copper, aluminum, chromium, platinum, titanium, nickel, tin, tungsten, palladium, molybdenum or a combination thereof, but the present disclosure is not limited thereto. In one embodiment of the present disclosure, as shown in FIG. 1A, the first bonding unit C1 may comprise a first sub-metal layer C11 and a second sub-metal layer C12, and the first sub-metal layer C11 is disposed between the first substrate 2 and the second sub-metal layer C12. The second bonding unit C2 may comprise a third sub-metal layer C21 and a fourth sub-metal layer C22, and the third sub-metal layer C21 is disposed between the second substrate 4 and the fourth sub-metal layer C22. The materials of the first sub-metal layer C11 and the third sub-metal layer C21 may be the same or different. The materials of the first sub-metal layer C11 and the third sub-metal layer C21 may respectively comprise molybdenum, copper, titanium or a combination thereof, but the present disclosure is not limited thereto. The materials of the second sub-metal layer C12 and the fourth sub-metal layer C22 may be the same or different. The materials of the second sub-metal layer C12 and the fourth sub-metal layer C22 may respectively comprise copper, tin, gold, nickel or a combination thereof, but the present disclosure is not limited thereto.

Figure 1B:
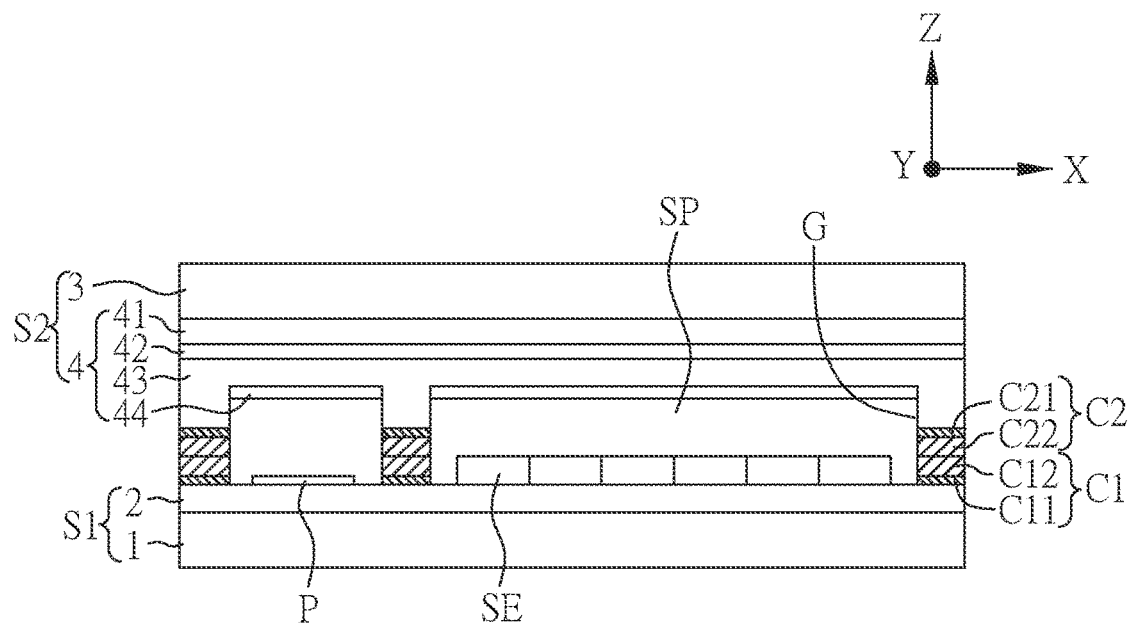

Next, as shown in FIG. 1B, the first temporary substrate S1 and the second temporary substrate S2 are assembled to bond the first substrate 2 and the second substrate 4. More specifically, the bonding process may be performed on the first bonding units C1 of the first temporary substrate S1 and the second bonding units C2 of the second temporary substrate S2 to bond the first bonding units C1 and the second bonding units C2, so the first substrate 2 and the second substrate 4 are bonded to form a sealed space SP. Herein, in the normal direction Z of the first substrate 2, the sensing elements SE and the cavity G are overlapped. In the present disclosure, the bonding process may include thermocompression bonding, eutectic bonding, laser welding, other suitable processes or a combination thereof. In one embodiment of the present disclosure, the sealed space SP may be in a vacuum or close to a vacuum state to reduce interference from other external environments (such as moisture, air, etc.) on the sensing signal.

Figure 1C:
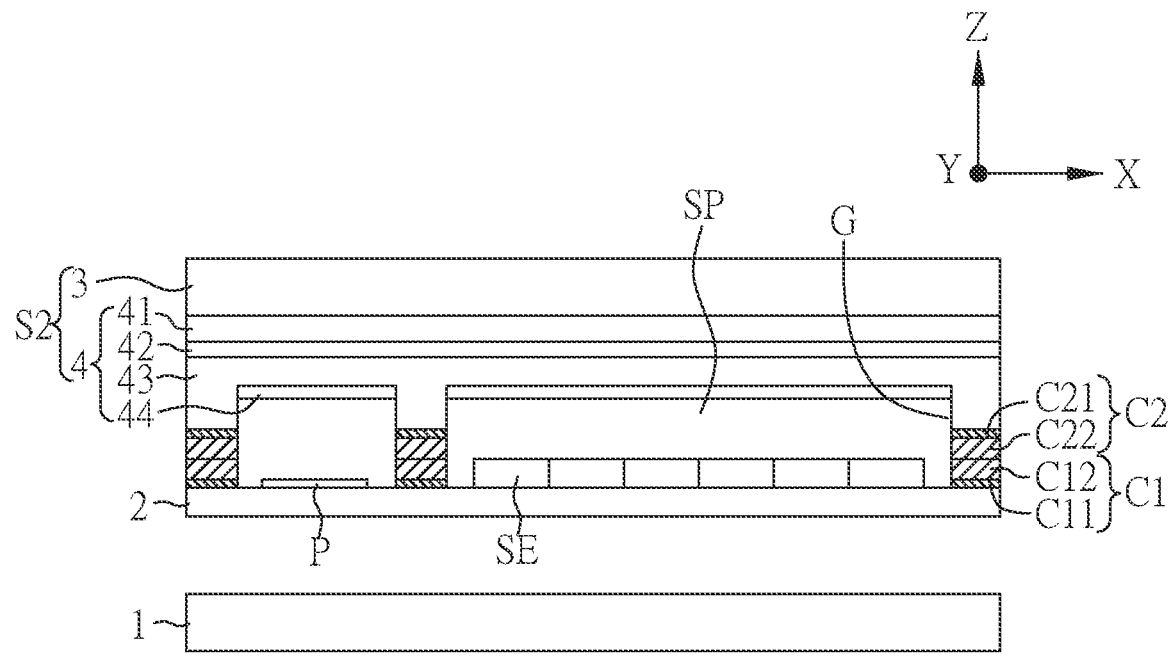
Figure 1D:
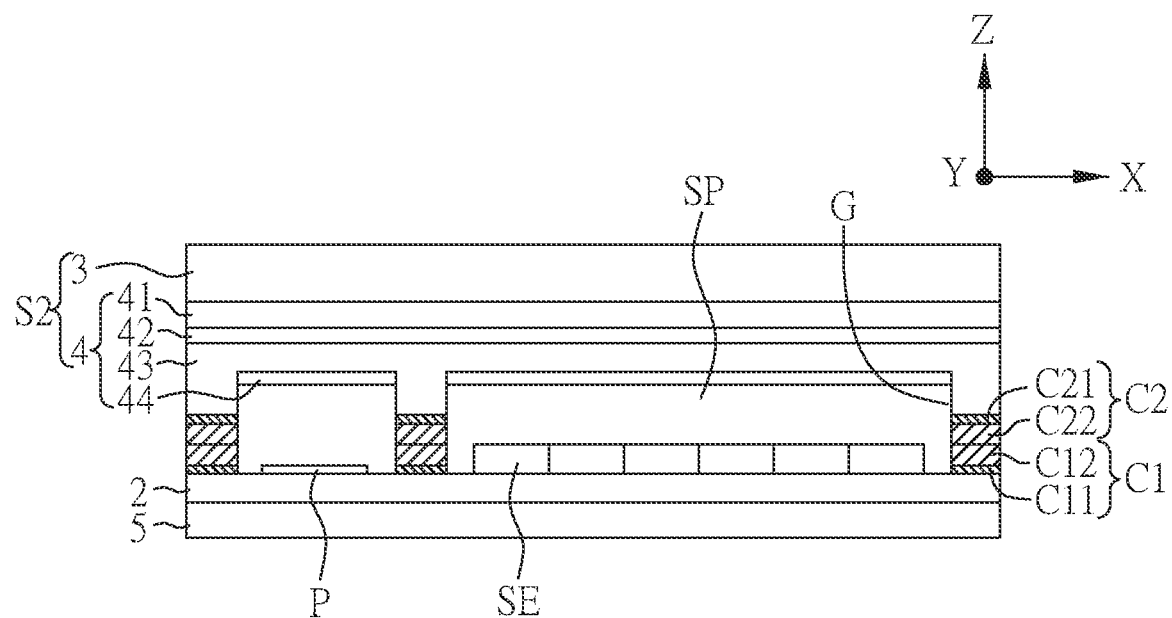

Then, as shown in FIG. 1C and FIG. 1D, the first carrier 1 is removed and the first substrate 2 is disposed on a supporting film 5. In the present disclosure, the first carrier 1 may be removed using laser lift off (LLO) or non-laser lift off technology. For example, for the laser lift off technology, the surface of the first substrate 2 adjacent to the first carrier 1 can be irradiated with laser to form a peelable interface between the first carrier 1 and the first substrate 2, thereby achieving the effect of separating the first carrier 1 and the first substrate 2. For example, for the non-laser lift off technology, the first carrier 1 and the first substrate 2 can be separated by etching a peeling layer (not shown in the figure) disposed between the first substrate 2 and the first carrier 1. In the present disclosure, the material of the supporting film 5 may comprise polycarbonate (PC), polyimide (PI), polypropylene (PP), polyethylene terephthalate (PET), polymethylmethacrylate (PMMA), other suitable materials or a combination thereof, but the present disclosure is not limited thereto. In one embodiment of the present disclosure, the hardness and/or thickness of the first carrier 1 is, for example, greater than the hardness and/or thickness of the supporting film 5.

Figure 1E:
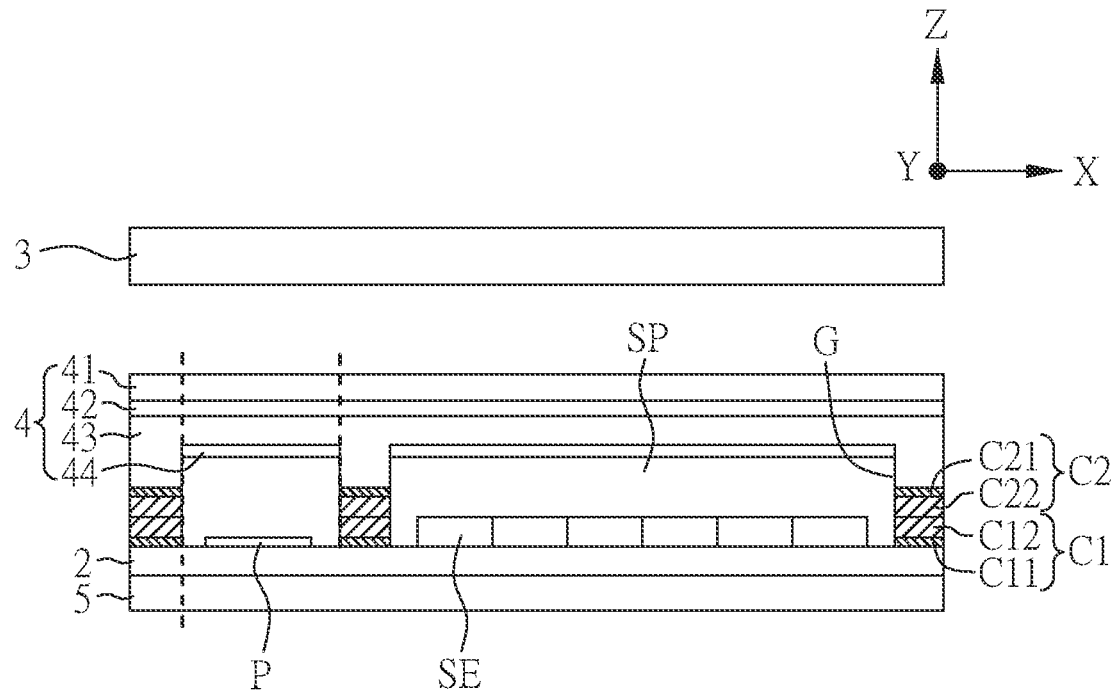
Figure 1F:
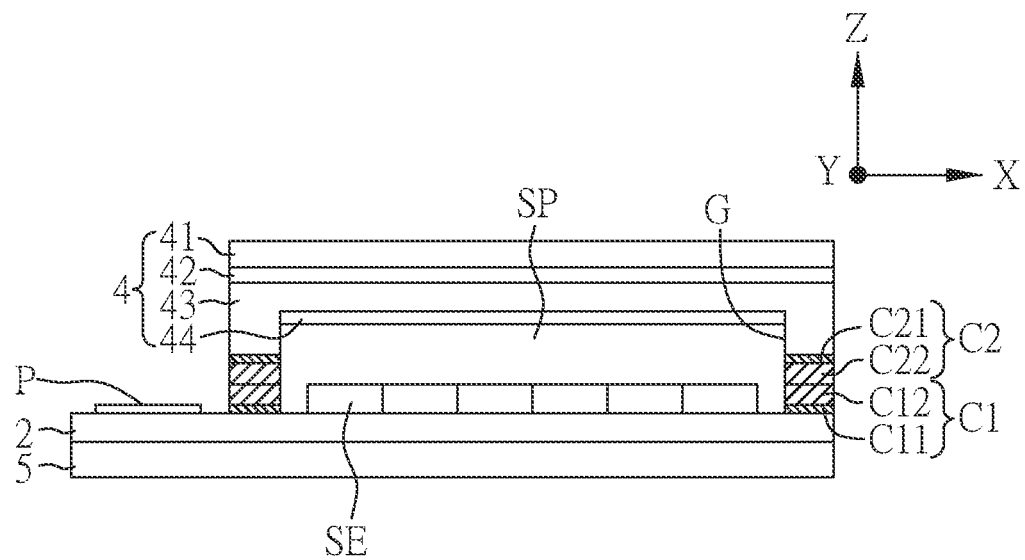

As shown in FIG. 1E and FIG. 1F, the second carrier 3 is removed; and the first substrate 2, the second substrate 4 and the supporting film 5 are cut to form the sensing device of the present disclosure. More specifically, the first substrate 2, the second substrate 4 and the supporting film 5 may be cut, for example, along the dotted lines in FIG. 1E respectively, thereby forming a sensing device with appropriate size, as shown in FIG. 1F. In the present disclosure, the method of removing the second carrier 3 is similar to the method of removing the first carrier 1 and is not described again. In the present disclosure, the method of cutting the first substrate 2, the second substrate 4 and the supporting film 5 may be performed, for example, by laser cutting, wheel knife cutting or a combination thereof.

In one embodiment of the present disclosure, as shown in FIG. 1F, the sensing device may comprise: a supporting film 5; a first substrate 2 disposed on the supporting film 5; a plurality of sensing elements SE disposed on the first substrate 2; and a second substrate 4 disposed corresponding to the first substrate 2 and bonded to the first substrate 2. Herein, the first substrate 2 and the second substrate 4 are respectively a flexible substrate, so the electronic device of the present disclosure is a flexible sensing device. In addition, as shown in FIG. 1F, the sensing device may further comprise a bonding pad P disposed on the first substrate 2, wherein the bonding pad P is disposed adjacent to the sensing elements SE and electrically connected to the sensing elements SE. The sensing elements SE may be electrically connected to external components (such as drivers Dr1, Dr2, or electronic components E in FIG. 6) through the bonding pad P to transmit or receive signals.

Figure 2A:
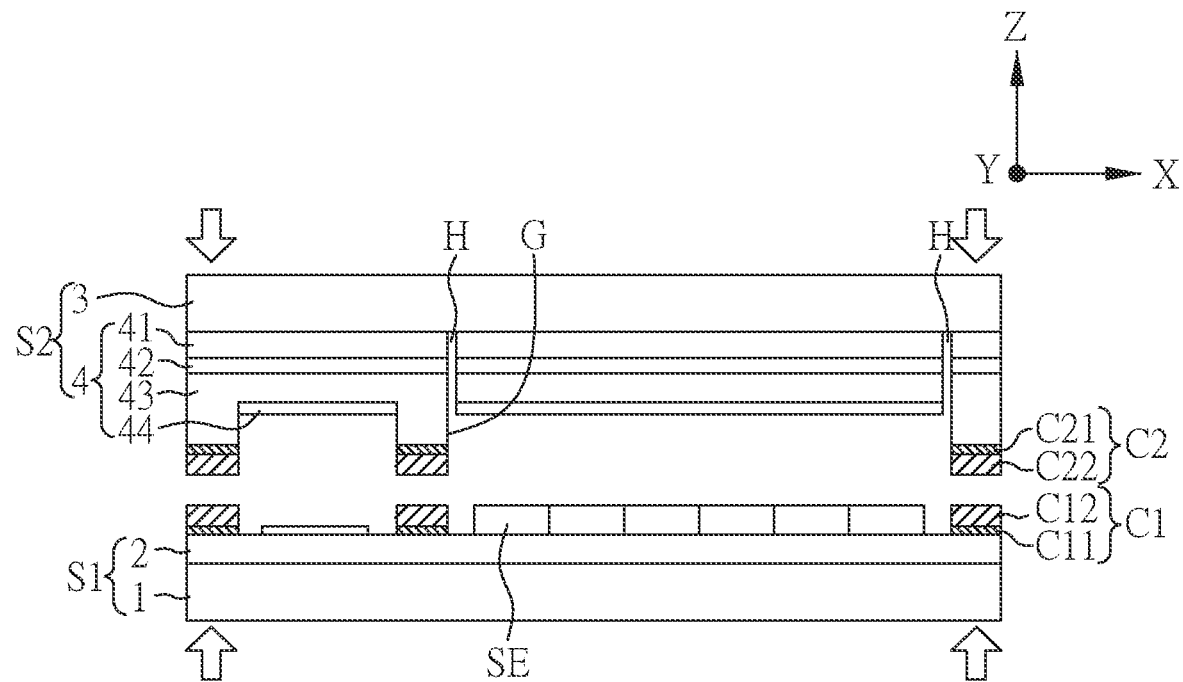
FIG. 2A and FIG. 2B are schematic views showing part of a method for manufacturing a sensing device according to one embodiment of the present disclosure.
Figure 2B:
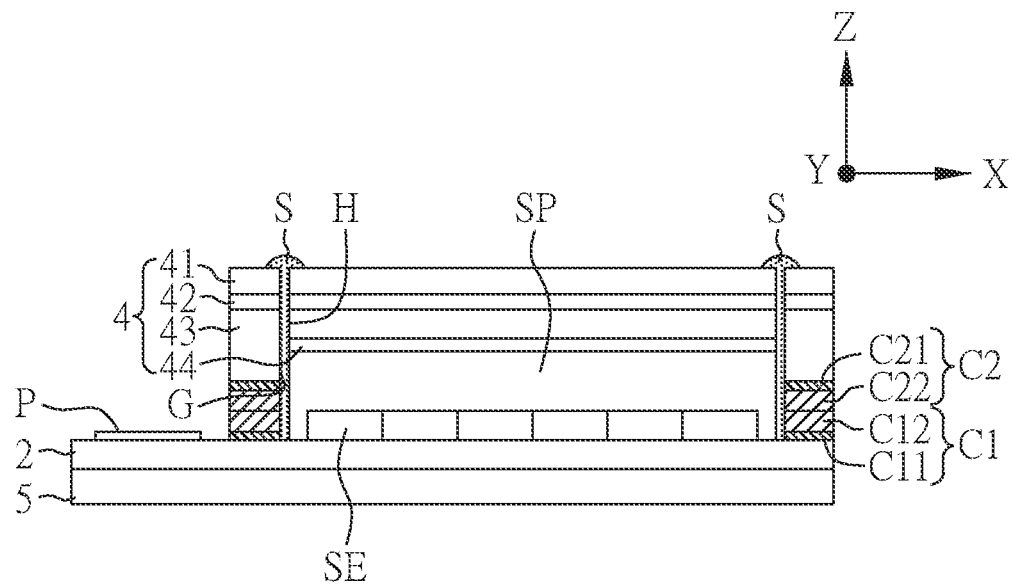

FIG. 2A and FIG. 2B are schematic views showing part of a method for manufacturing a sensing device according to one embodiment of the present disclosure. The method of FIG. 2A and FIG. 2B is similar to the aforementioned method, except for the following differences.

In one embodiment of the present disclosure, as shown in FIG. 2A, the second substrate 4 may comprise a through hole H. When the first temporary substrate S1 and the second temporary substrate S2 are assembled, in the normal direction Z of the first substrate 2, the sensing elements SE and the through hole H are not overlapped. The through hole H is a hole that penetrates the second substrate 4. The through hole H can be used for pressure balance to reduce the risk of damage to the second substrate 4 due to pressure changes during processing. In the present disclosure, the method of forming the through hole H may be, for example, mechanical drilling, laser drilling, or a combination thereof, but the present disclosure is not limited thereto.

Next, steps such as substrate bonding and removal of the first carrier 1 shown in FIG. 1B to FIG. 1D are performed in sequence. Then, the second carrier 3 is removed; a sealing unit S is disposed in the through hole H of the second substrate 4; and the first substrate 2, the second substrate 4 and the supporting film 5 are cut to form the sensing device shown in FIG. 2B. Thus, as shown in FIG. 2B, the sensing device of the present disclosure may further comprise a sealing unit S disposed in the through hole H of the second substrate 4, wherein the sensing elements SE is not overlapped with the through hole H and the sealing unit S in the normal direction Z of the first substrate 2.

In the present disclosure, after removing the second carrier 3, the step of disposing the sealing unit S in the through hole H of the second substrate 4 may be performed first, and then the step of cutting the first substrate 2, the second substrate 4 and the supporting film 5 may be performed, but the present disclosure is not limited thereto. The order of the steps of disposing the sealing unit S and cutting can be adjusted according to needs. In the present disclosure, the material of the sealing unit S may comprise glass glue, optical glue, silicone glue, tape, hot melt glue, AB glue, two-component adhesive, light-curing glue, polymer glue, resin or a combination thereof, but the present disclosure is not limited thereto.

Figure 3:
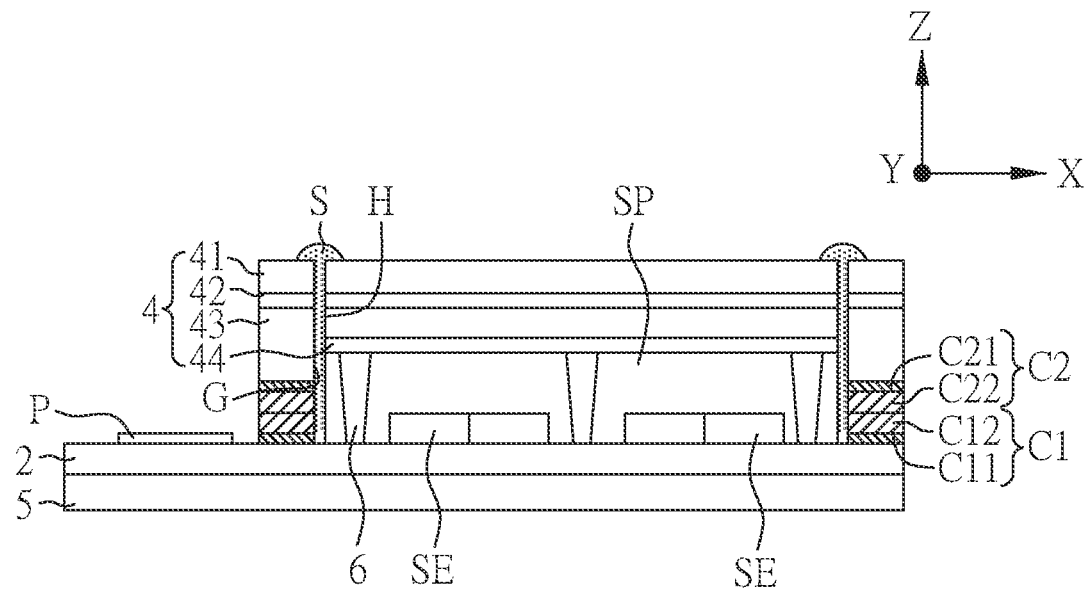
FIG. 3 is a schematic cross-sectional view of a sensing device according to one embodiment of the present disclosure.

FIG. 3 is a schematic cross-sectional view of a sensing device according to one embodiment of the present disclosure. The sensing device shown in FIG. 3 is similar to that shown FIG. 2B except for the following differences.

In one embodiment of the present disclosure, the method may further comprise a step of: disposing a plurality of supporting units 6 on the second substrate 4 before the step of assembling the first temporary substrate S1 and the second temporary substrate S2. In another embodiment of the present disclosure, the method may further comprise a step of: disposing a plurality of supporting units 6 on the first substrate 2 before the step of assembling the first temporary substrate S1 and the second temporary substrate S2. Thus, as shown in FIG. 3, the sensing device may further comprise a plurality of supporting units 6 disposed between the first substrate 2 and the second substrate 4, wherein the supporting units 6 and the cavity G may be overlapped in the normal direction Z of the first substrate 2. In one embodiment of the present disclosure, one of the supporting units 6 is disposed between two adjacent sensing elements SE. In one embodiment of the present disclosure, at least one of the supporting units 6 may be in contact with the first substrate 2 and/or the second substrate 4.

In the present disclosure, the supporting units 6 may maintain the distance between the first substrate 2 and the second substrate 4 above a specific distance to reduce damage to the circuit layers or components provided between the first substrate 2 and the second substrate 4 during the processing and improve the reliability of the sensing device. In one embodiment of the present disclosure, in the normal direction Z of the first substrate 2, the supporting units 6 and the sensing elements SE are not overlapped, thereby avoiding damage to the sensing elements SE during processing. In the present disclosure, the material of the supporting units 6 may comprise resin, polymer, photoresist material or a combination thereof, but the present disclosure is not limited thereto.

Figure 4:
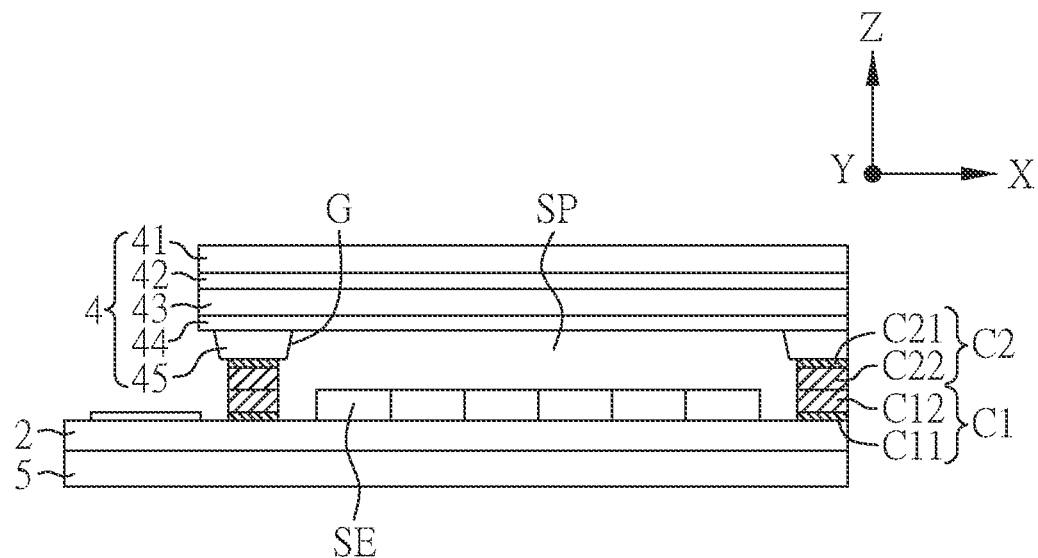
FIG. 4 is a schematic cross-sectional view of a sensing device according to one embodiment of the present disclosure.

FIG. 4 is a schematic cross-sectional view of a sensing device according to one embodiment of the present disclosure. The sensing device shown in FIG. 4 is similar to that shown FIG. 1F except for the following differences.

In one embodiment of the present disclosure, as shown in FIG. 4, the second substrate 4 may further comprise a plurality of protrusions 45 disposed on the optical film 44, wherein the second bonding units C2 are respectively disposed on the protrusions 45. Therefore, in the normal direction Z of the first substrate 2, the second bonding units C2 and the optical film 44 may be overlapped. In one embodiment of the present disclosure, as shown in FIG. 4, the cavity G of the second substrate 4 may be formed by the protrusions 45 and the optical film 44.

In the present disclosure, the material of the protrusions 45 may comprise resin, polymer, photoresist material or a combination thereof, but the present disclosure is not limited thereto. In the present disclosure, the method of forming the protrusions 45 may be, for example, depositing the material of the protrusions 45 on the optical film 44 first, and then patterning through a lithography process to form the protrusions 45 on the optical film 44; but the present disclosure is not limited thereto.

Figure 5:
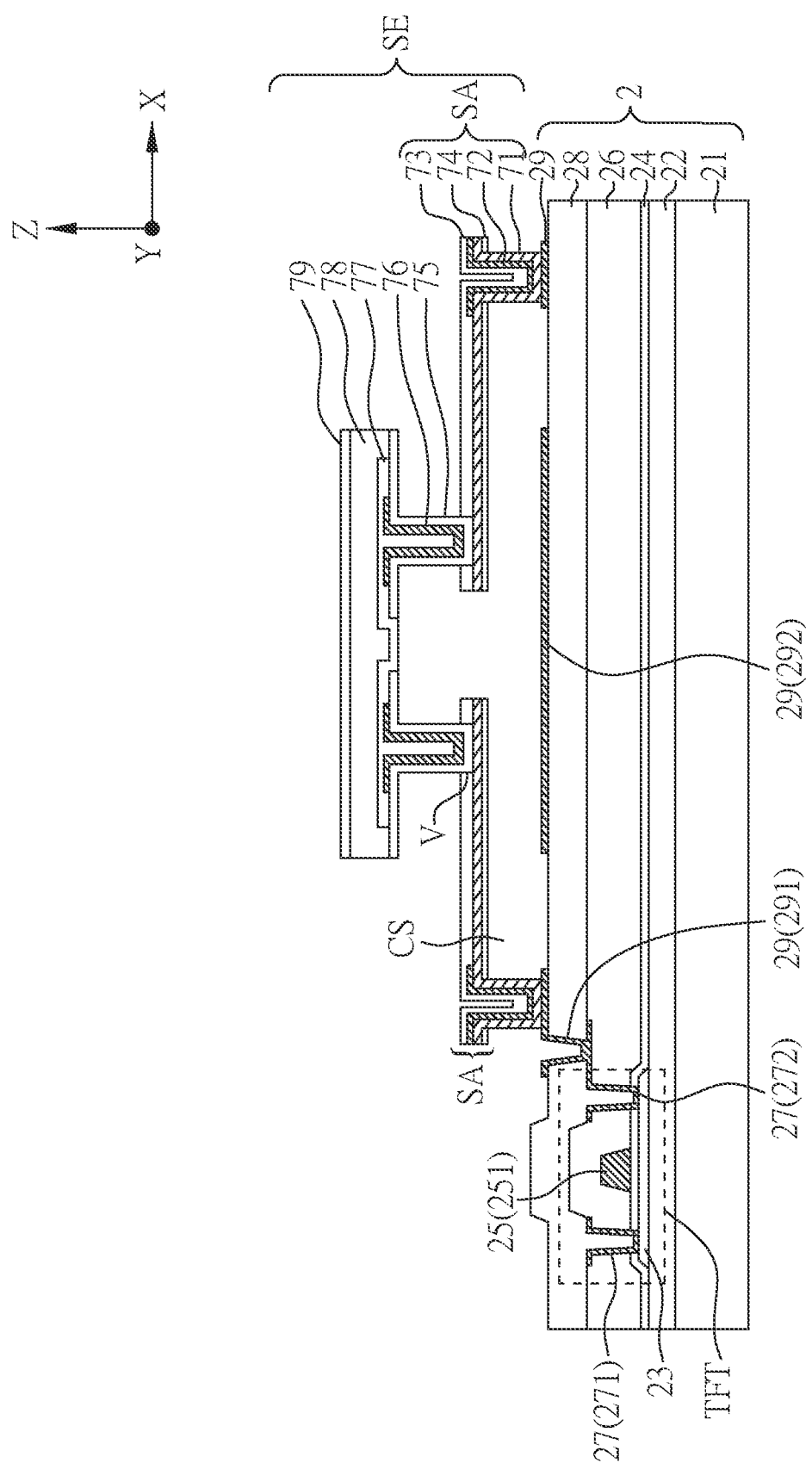
FIG. 5 is a schematic cross-sectional view of part of a sensing device according to one embodiment of the present disclosure.

FIG. 5 is a schematic cross-sectional view of part of a sensing device according to one embodiment of the present disclosure.

In one embodiment of the present disclosure, the first substrate 2 of the sensing device may be shown, for example, in FIG. 5, wherein the first substrate 2 may comprise: a substrate 21; a buffer layer 22 disposed on the substrate 21; an active layer 23 disposed on the buffer layer 22; a first insulating layer 24 disposed on the active layer 23; a first metal layer 25 disposed on the first insulating layer 24 and comprising a gate electrode 251; a second insulating layer 26 disposed on the first metal layer 25; a second metal layer 27 disposed on the second insulating layer 26 and comprising a source electrode 271 and a drain electrode 272, wherein the active layer 23, the first insulating layer 24, the gate electrode 251, the second insulating layer 26, the source electrode 271 and the drain electrode 272 form a transistor TFT; a third insulating layer 28 disposed on the second metal layer 27; and a third metal layer 29 disposed on the third insulating layer 28.

In one embodiment of the present disclosure, as shown in FIG. 5, the sensing element SE disposed on the first substrate 2 may comprise: a supporting material layer 71 disposed on the third metal layer 29 and electrically connected to the third metal layer 29; a fourth metal layer 72 disposed on the supporting material layer 71; a first passivation layer 73 disposed on the fourth metal layer 72, wherein the first passivation layer 73 comprises a plurality of vias V to expose the supporting material layer 71; a second passivation layer 74, wherein the supporting material layer 71 is disposed between the first passivation layer 73 and the second passivation layer 74; an absorbing layer 75 disposed on the first passivation layer 73 and connected to the supporting material layer 71 through the vias V of the first passivation layer 73; a fifth metal layer 76 disposed on the absorbing layer 75; a third passivation layer 77 disposed on the fifth metal layer 76; a sensing layer 78 disposed on the third passivation layer 77; and a fourth passivation layer 79 disposed on the sensing layer 78. In the present disclosure, light in a specified wavelength range may be absorbed by the absorbing layer 75 to generate heat. The heat is transmitted to the sensing layer 78 through the fifth metal layer 76 and the third passivation layer 77. The resistance of the sensing layer 78 is changed as the heat changes to form an electrical signal, thereby allowing the sensing elements SE to sense light in a specified wavelength range. In the present disclosure, the specified wavelength range may be, for example, between 8 μm and 20 μm or between 8 μm and 14 μm, but the present disclosure is not limited thereto.

In the present disclosure, as shown in FIG. 5, the supporting material layer 71, the fourth metal layer 72, the first passivation layer 73 and the second passivation layer 74 may form two adjacent supporting arms SA to support the absorbing layer 75 and other components above. There is a cavity structure CS between the third metal layer 29 and the two adjacent supporting arms SA and absorbing layer 75. The cavity structure CS may be formed by respectively disposing a sacrificial layer on the third metal layer 29 and the supporting arms SA, and then removing the sacrificial layer. The cavity structure CS may be used to prevent heat loss. In addition, the third metal layer 29 may comprise a sub-metal layer 291 and a sub-metal layer 292. The sub-metal layer 291 may be connected to the transistor TFT for transmitting or receiving signals. The sub-metal layer 292 may be disposed in the cavity structure CS, and may be used as a reflective layer to reflect light to the absorbing layer 75, thereby improving light utilization.

In the present disclosure, the material of the substrate 21 may 21 may comprise polycarbonate (PC), polyimide (PI), polypropylene (PP), polyethylene terephthalate (PET), polymethylmethacrylate (PMMA), other suitable material or a combination thereof, but the present disclosure is not limited thereto. In the present disclosure, the buffer layer 22, the first insulating layer 24, the second insulating layer 26 and the third insulating layer 28 may be made of the same or different materials. Materials of the buffer layer 22, the first insulating layer 24, the second insulating layer 26 and the third insulating layer 28 may respectively comprise silicon nitride, silicon oxide, silicon oxynitride, silicon carbonitride, or a combination thereof, but the present disclosure is not limited thereto. In the present disclosure, the material of the active layer 23 may comprise amorphous silicon, polycrystalline silicon (such as low-temperature polycrystalline silicon (LTPS)), or oxide semiconductor (such as indium gallium zinc oxide (IGZO) or indium gallium oxide (IGO)), but the present disclosure is not limited thereto. In the present disclosure, the materials of the first metal layer 25, the second metal layer 27 and the third metal layer 29 may be the same or different, wherein the materials of the first metal layer 25, the second metal layer 27 and the third metal layer 29 may respectively comprise gold, silver, copper, palladium, platinum (Pt), ruthenium (Ru), aluminum, cobalt, nickel, titanium, molybdenum (Mo), manganese, zinc, an alloy thereof, or a combination thereof, but the present disclosure is not limited thereto.

In addition, in the present disclosure, the material of the supporting material layer 71 may comprise titanium nitride (TiN), titanium aluminide (TiAl), titanium aluminium nitride (TiAlN), titanium aluminum oxide (TiAlO), titanium silicon aluminum (TiSiAl), titanium tungsten (TiW), titanium tungsten nitride (TiWN), aluminum nitride (AlNx) or a combination thereof, but the present disclosure is not limited thereto. In the present disclosure, the materials of the fourth metal layer 72 and the fifth metal layer 76 may be the same or different, wherein the materials of the fourth metal layer 72 and the fifth metal layer 76 may respectively comprise molybdenum (Mo), molybdenum nitride (MoN), molybdenum tungsten (MoW), tungsten (W) or a combination thereof, but the present disclosure is not limited thereto. In the present disclosure, the materials of the first passivation layer 73, the second passivation layer 74, the third passivation layer 77 and the fourth passivation layer 79 may be the same or different, wherein the materials of the first passivation layer 73, the second passivation layer 74, the third passivation layer 77 and the fourth passivation layer 79 may respectively comprise silicon oxide, silicon oxynitride, silicon nitride, aluminum oxide, resin, polymer, photoresist material or a combination thereof, but the present disclosure is not limited thereto. In the present disclosure, the material of the absorbing layer 75 may comprise titanium, titanium nitride (TiN), platinum, gold, nickel, niobium (Nb), an alloy thereof, or a combination thereof, but the present disclosure is not limited thereto. In the present disclosure, the material of the sensing layer 78 may comprise amorphous silicon, vanadium oxide (VOx), yttrium barium copper oxide (YBaCuO), silicon germanium oxide (GeSiO), silicon-germanium (SiGe), bismuth lanthanum strontium manganese oxide (BiLaSrMnO) or a combination thereof, but the present disclosure is not limited thereto. In one embodiment of the disclosure, the sensing layer 78 includes a thermistor, but the present disclosure is not limited thereto. In the present disclosure, the specified wavelength range may be, for example, between 8 μm and 20 μm or between 8 μm and 14 μm, but the present disclosure is not limited thereto.

Figure 6:
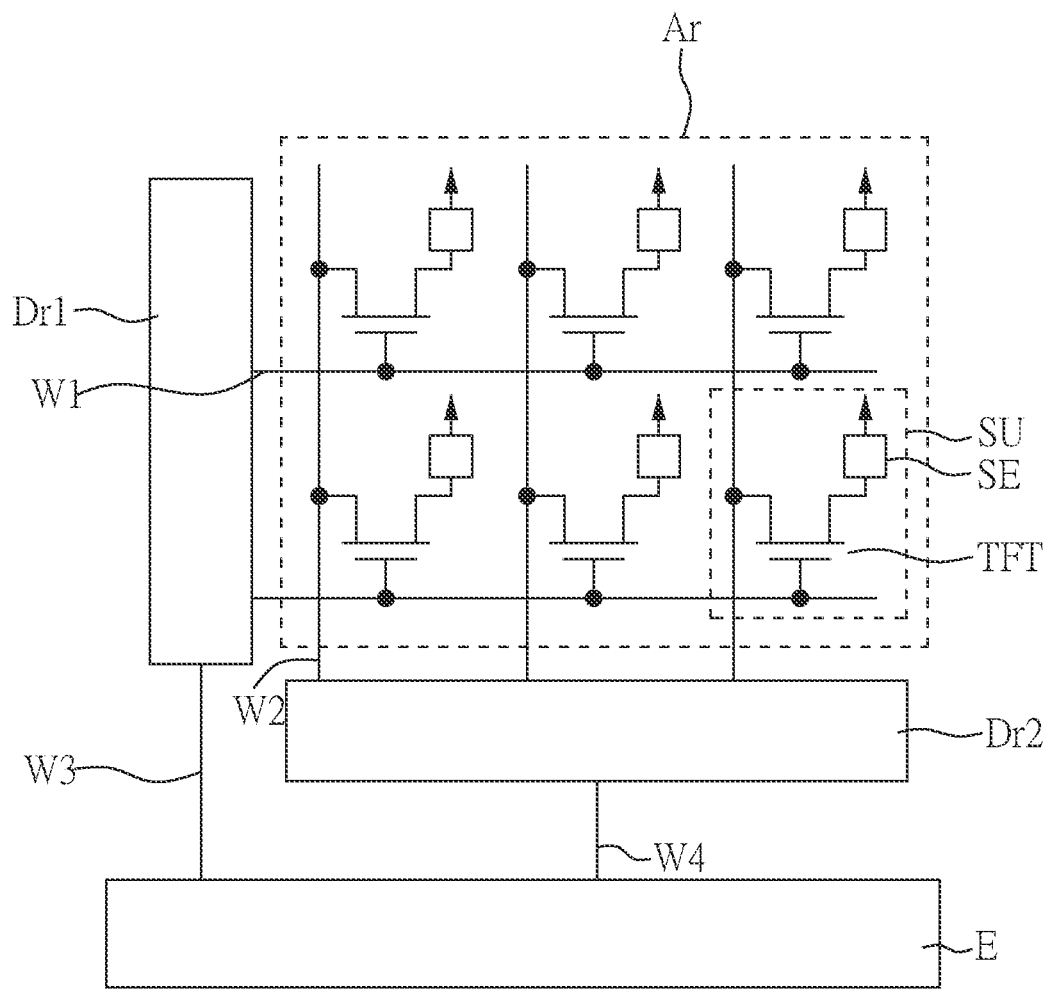
FIG. 6 is an equivalent circuit diagram of a sensing device according to one embodiment of the present disclosure.

FIG. 6 is an equivalent circuit diagram of a sensing device according to one embodiment of the present disclosure.

In one embodiment of the present disclosure, as shown in FIG. 6, the sensing device may comprise: a sensing array Ar, where the sensing array Ar includes a plurality of sensing units SU for sensing light within a wavelength range; and drivers Dr1, Dr2, wherein the drivers Dr1, Dr2 are respectively electrically connected to each sensing element SU in the sensing array Ar.

More specifically, as shown in FIG. 6, each sensing unit SU may comprise: a sensing element SE, used for sensing light within a specified wavelength range; and a transistor TFT, electrically connected to the sensing element SE. The drivers Dr1, Dr2 may be electrically connected to the transistor TFT in each sensing unit SU through a first conductive line W1 and a second conductive line W2 respectively, so as to transmit or receive signals to achieve the purpose of sensing. For example, the driver Dr1 may transmit the control signal through the first conductive line W1 to control the sensing unit SU; or the driver Dr2 may receive the sensing signal generated by the sensing unit SU through the second conductive line W2 respectively.

In the present disclosure, as shown in FIG. 6, the sensing device may further comprise an electronic component E electrically connected to the drivers Dr1, Dr2 respectively. More specifically, the electronic component E may be electrically connected to the driver Dr1 through a conductive line W3, and may be electrically connected to the driver Dr2 through a conductive line W4. The electronic component E may be used, for example, to control or process signals transmitted to the driver Dr1 or to receive signals from the driver Dr2. In one embodiment of the present disclosure, the electronic component E may be an integrated circuit (IC), but the present disclosure is not limited thereto. In addition, although one driver Dr1 and one driver Dr2 is used as an example in FIG. 6, in other embodiments of the present disclosure, the sensing device may comprise a plurality of drivers Dr1 and/or a plurality of drivers Dr2, which may be electrically connected to the electronic component E through a plurality of conductive lines W3 and/or a plurality of conductive lines W4 respectively.

The above specific examples are to be construed as illustrative only and not in any way limiting of the remainder of the disclosure.

Although the present disclosure has been explained in relation to its embodiment, it is to be understood that many other possible modifications and variations can be made without departing from the spirit and scope of the disclosure as hereinafter claimed.

The invention claimed is:

1. A method for manufacturing a sensing device, comprising the following steps:
   providing a first temporary substrate, wherein the first temporary substrate comprises: a first carrier; a first substrate disposed on the first carrier; and a plurality of sensing elements disposed on the first substrate;
   providing a second temporary substrate, wherein the second temporary substrate comprises:
   a second carrier; and
   a second substrate disposed on the second carrier;
   disposing a plurality of supporting units on the first substrate or the second substrate;
   assembling the first temporary substrate and the second temporary substrate to bond the first substrate and the second substrate so that the first substrate and the second substrate are bonded to form a sealed space, wherein the plurality of supporting units and the plurality of sensing elements are disposed in the sealed space;
   removing the first carrier and disposing the first substrate on a supporting film; and
   removing the second carrier,
   wherein the first substrate and the second substrate are respectively a flexible substrate.

2. The method of claim 1, wherein the second substrate comprises a cavity, and the plurality of sensing elements and the cavity are overlapped in a normal direction of the first substrate when the first temporary substrate and the second temporary substrate are assembled.

3. The method of claim 2, wherein the first temporary substrate comprises a plurality of first bonding units disposed on the first substrate, and the plurality of sensing elements are disposed between two adjacent first bonding units of the plurality of first bonding units; wherein the second temporary substrate comprises a plurality of second bonding units disposed on the second substrate, and the cavity locates between two adjacent second bonding units of the plurality of second bonding units; wherein the method further comprises a step of bonding the plurality of first bonding units and the plurality of second bonding units before the step of removing the first carrier.

4. The method of claim 1, further comprising a step of: cutting the first substrate, the second substrate and the supporting film.

5. The method of claim 1, further comprising a step of: disposing a sealing unit in a through hole of the second substrate.

6. The method of claim 1, wherein one of the plurality of supporting units is disposed between two adjacent sensing elements of the plurality of sensing elements.

7. The method of claim 1, wherein the second substrate comprises a cavity, and the plurality of supporting units and the cavity are overlapped in a normal direction of the first substrate when the first temporary substrate and the second temporary substrate are assembled.

8. A sensing device, comprising:
a supporting film;
a first substrate disposed on the supporting film;
a plurality of sensing elements disposed on the first substrate;
a second substrate disposed corresponding to the first substrate and bonded to the first substrate; and
a plurality of supporting units disposed between the first substrate and the second substrate,
wherein the first substrate and the second substrate are respectively a flexible substrate, and
wherein the first substrate and the second substrate are bonded to form a sealed space, and the plurality of supporting units and the plurality of sensing elements are disposed in the sealed space.

9. The sensing device of claim 8, wherein the second substrate comprises a cavity, and the plurality of sensing elements and the cavity are overlapped in a normal direction of the first substrate.

10. The sensing device of claim 9, further comprising:
a plurality of first bonding units disposed on the first substrate, wherein the plurality of sensing elements are disposed between two adjacent first bonding units of the plurality of first bonding units; and
a plurality of second bonding units disposed on the second substrate, wherein the cavity locates between two adjacent second bonding units of the plurality of second bonding units, wherein the first substrate is bonded to the second substrate through the plurality of first bonding units and the plurality of second bonding units.

11. The sensing device of claim 10, wherein the second substrate comprises a plurality of protrusions, and the plurality of second bonding units are respectively disposed on the plurality of protrusions.

12. The sensing device of claim 8, wherein the second substrate comprises a through hole, and the plurality of sensing elements and the through hole are not overlapped in a normal direction of the first substrate.

13. The sensing device of claim 12, further comprising a sealing unit disposed in the through hole of the second substrate.

14. The sensing device of claim 8, wherein one of the plurality of supporting units is disposed between two adjacent sensing elements of the plurality of sensing elements.

15. The sensing device of claim 8, wherein at least one of the plurality of supporting units is in contact with the first substrate or the second substrate.

16. The sensing device of claim 8, wherein the second substrate comprises: a substrate; an optical film disposed on the substrate; and a filter layer disposed on the optical film.

17. The sensing device of claim 8, wherein the second substrate comprises: a substrate; a filter layer disposed on the substrate; and an optical film disposed on the filter layer.

18. The sensing device of claim 8, wherein the second substrate comprises a filter layer, and a thickness of the filter layer ranges from 1 μm to 100 μm.

* * * * *